US007099481B2

(12) United States Patent
Baker et al.

(10) Patent No.: US 7,099,481 B2
(45) Date of Patent: Aug. 29, 2006

(54) METHOD AND SYSTEM FOR AUTOMATICALLY DETECTING AND POWERING PC SPEAKERS

(75) Inventors: Brian A. Baker, Raleigh, NC (US); Mark A. Casparian, Raleigh, NC (US); Kenneth S. Seethaler, Raleigh, NC (US); Gregory J. Zandt, Semora, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 711 days.

(21) Appl. No.: 09/858,135

(22) Filed: May 15, 2001

(65) Prior Publication Data

US 2002/0172371 A1 Nov. 21, 2002

(51) Int. Cl.
*H04R 29/00* (2006.01)
*H04R 3/00* (2006.01)
*H04R 1/00* (2006.01)
*H03F 21/00* (2006.01)

(52) U.S. Cl. .......................... 381/58; 381/59; 381/111; 381/74; 381/120

(58) Field of Classification Search .................. 381/58, 381/59, 123, 111; 700/94
See application file for complete search history.

(56) References Cited

U.S. PATENT DOCUMENTS

| | | | | |
|---|---|---|---|---|
| 5,165,097 | A | 11/1992 | Morishima et al. | |
| 5,216,379 | A | 6/1993 | Hamley | |
| 5,303,397 | A | 4/1994 | Aoki | |
| 5,532,649 | A | 7/1996 | Sahyoun | |
| 5,625,698 | A * | 4/1997 | Barbetta | 381/96 |
| 5,910,991 | A | 6/1999 | Farrar | |
| 6,359,987 | B1 * | 3/2002 | Tran et al. | 381/58 |
| 6,374,148 | B1 * | 4/2002 | Dharmarajan et al. | 700/94 |
| 6,473,663 | B1 * | 10/2002 | Gulick | 700/94 |
| 6,618,636 | B1 * | 9/2003 | Sakai et al. | 700/94 |

* cited by examiner

*Primary Examiner*—Laura A. Grier
(74) *Attorney, Agent, or Firm*—Scott W. Reid; Dillon & Yudell LLP

(57) ABSTRACT

A method of powering an audio output device of a computer system, by determining whether a passive or active audio output device is connected to an audio output jack of the computer system and, based on this determination, providing an appropriate power level to the audio output jack. For example, if the determination is made that a passive audio output device is connected to the audio output jack, then a 3-watt power signal is applied to the audio output jack, but if the determination is made that an active audio output device is connected to the audio output jack, then a ¼-watt power signal is applied to the audio output jack. The type of audio output device present may be determined by sensing an impedance at the audio output jack. This sensing may be performed by comparing a load voltage associated with the impedance to a reference voltage. The output of a switch device (multiplexer) having a first input from an AC97 audio codec and headphone amplifier and a second input from a passive speaker amplifier is selectively controlled by the sensing circuit.

11 Claims, 4 Drawing Sheets

METHOD AND SYSTEM FOR AUTOMATICALLY DETECTING AND POWERING PC SPEAKERS

BACKGROUND OF THE INVENTION

1. Technical Field

The present invention generally relates to computer systems, and more particularly to a method of dynamically adjusting an audio subsystem of a computer system to support different types of audio output devices, e.g., speakers or headphones.

2. Description of Related Art

A typical structure for a conventional computer system includes one or more processing units connected to a system memory device (random access memory or RAM) and to various peripheral, or input/output (I/O), devices such as a display monitor, a keyboard, a graphical pointer (mouse), and a permanent storage device (hard disk). The system memory device is used by a processing unit in carrying out program instructions, and stores those instructions as well as data values that are fed to or generated by the programs. A processing unit communicates with the other components by various means, including one or more interconnects (buses), or direct access channels. A computer system may have many additional components, such as serial, parallel, and universal serial bus (USB) ports for connection to, e.g., printers, and network adapters. Other components might further be used in conjunction with the foregoing; for example, a display adapter might be used to control a video display monitor, a memory controller can be used to access the system memory, etc.

One other common feature of modem computers is audio capability. Many computers have built-in speakers, some offering quality stereo listening, not only in desktop computers, but in portable (laptop or notebook) computers as well. Desktop and portable computers also commonly provide an audio subsystem I/O device on the main circuit board ("motherboard"), having one or more jacks for connecting to various audio devices, such as speakers, headphones, microphones, MIDI music sources, etc. The ports for a typical audio subsystem are illustrated in FIG. 1. The ports are mounted on the motherboard 1 and include a line in jack 2, a line out jack 3, and a mic in jack 4. Line in jack 2 receives a plug from an audio source (i.e. cassette deck) 5, line out jack 3 receives a plug from a speaker pair 6, and mic in jack 4 receives a plug from a microphone 7. This configuration is typical of various computer types, particularly those computers referred to as IBM-compatible, or personal computers (PCs).

Many computer vendors are driving the strategic direction of the consumer brand of PCs towards the direct model. This model is based on the idea of building a PC towards a customer's unique requirements or specifications. One area of concern in this regard has been the audio subsystem. The computer manufacturer cannot know at the factory what kind of audio devices may ultimately be installed on a unit; for example, a model may be shipped with "passive" speakers, or "active" speakers. Passive speakers are those having minimal integrated electronics and no power supply (typically small speakers). Active speakers are powered by a separate power source. To achieve the lowest possible cost for a consumer model, an audio amplifier can be mounted on the motherboard to provide adequate power for passive audio speakers. Such a setup requires the passive speakers to be powered from a separate jack with, e.g., three watts per channel. If one wishes to upgrade to a set of external active speakers (requiring a power AD/DC power adapter), they must be powered from another jack (line out jack 3), which is typically powered with one-quarter watt per channel.

In the foregoing design, the planar (motherboard) provides both a line-out jack and a speaker out jack, but it is extremely rare that both of these ports would be in use. There is accordingly a cost increase of the planar due to the additional connectors and circuitry, and the size (area) of the planar is further negatively impacted. As the area of planars continues to decrease, there is less board edge to place these additional connectors. Another problem with providing two audio output jacks is the resulting customer confusion as to which jack is to be used. This confusion not only leads to excessive support calls which cost the manufacturer, but can further damage the audio subsystem (from overdriving active speakers).

One solution to the foregoing problem is to simply provide only one audio output jack, and allow the customer to make appropriate hardware or software adjustments depending upon the intended audio output device. For example, a physical switch (jumpers) may be provided on the planar board, and the customer must open up the cover, go inside the PC and set the jumpers depending upon whether they wish to use passive or active speakers. If the customer orders a model (which is shipped preset for passive speakers) and they also order an upgraded pair of active speakers, the customer will have to open up the cover and change jumper settings to set the PC for active speakers. The primary problem with this approach is that, if the customer opens up the box and accidently manipulates the wrong set of jumpers (or otherwise damages any internal components), then the warranty for the PC becomes invalid. Also, if the customer sets these particular jumpers incorrectly, it can damage (overdrive) their active speakers, or they will not hear anything from their passive speakers. Either result again leads to increased costs on the manufacturer's part for support calls, as well as shipping new parts to replace damaged goods.

Alternatively, the customer can make software adjustments, e.g., in the computers' basic input/output system (BIOS) to select either passive or active speakers. This approach requires the customer to enter the BIOS setup screen and modify the BIOS settings, but most consumers are unfamiliar with this process. This solution assumes the customer reads the relevant documentation first, but this is rarely the case. Most manufacturer's dislike customers adjusting BIOS settings unless it is critically necessary. If a customer accidentally makes an incorrect change to the BIOS settings, it may lead to severe trouble. There is generally no reason to take such risks just to support a speaker, and incorrect changes can again result in support calls, delivering new parts, and quality perception. It is also possible that incorrect settings may damage active speakers.

In light of the foregoing it would be desirable to provide an improved method of determining which type of speaker is connected to the audio subsystem, and to power it appropriately. It would be further advantageous if the method did not require user intervention so as to avoid problems associated with incorrect user adjustments.

SUMMARY OF THE INVENTION

It is therefore one object of the present invention to provide an improved audio subsystem for a computer system.

It is another object of the present invention to provide such an improved audio subsystem which supports multiple audio output devices, such as passive and active speakers.

It is yet another object of the present invention to provide a method of automatically detecting and power speakers or headphones of a computer system.

The foregoing objects are achieved in a method of powering an audio output device of a computer system, generally comprising the steps of determining whether a passive or active audio output device is connected to an audio output jack of the computer system and, based on said determination, providing one of a plurality of different power levels to the audio output jack. For example, if the determination is made that a passive audio output device is connected to the audio output jack, then a 3-watt power signal is applied to the audio output jack, but if the determination is made that an active audio output device is connected to the audio output jack, then a ¼-watt power signal is applied to the audio output jack. The type of audio output device present may be determined by sensing an impedance at the audio output jack. This sensing may be performed by comparing a load voltage associated with the impedance to a reference voltage. The output of a switch device (multiplexer) having a first input from an active speaker amplifier and a second input from a passive speaker amplifier is selectively controlled by the sensing means.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
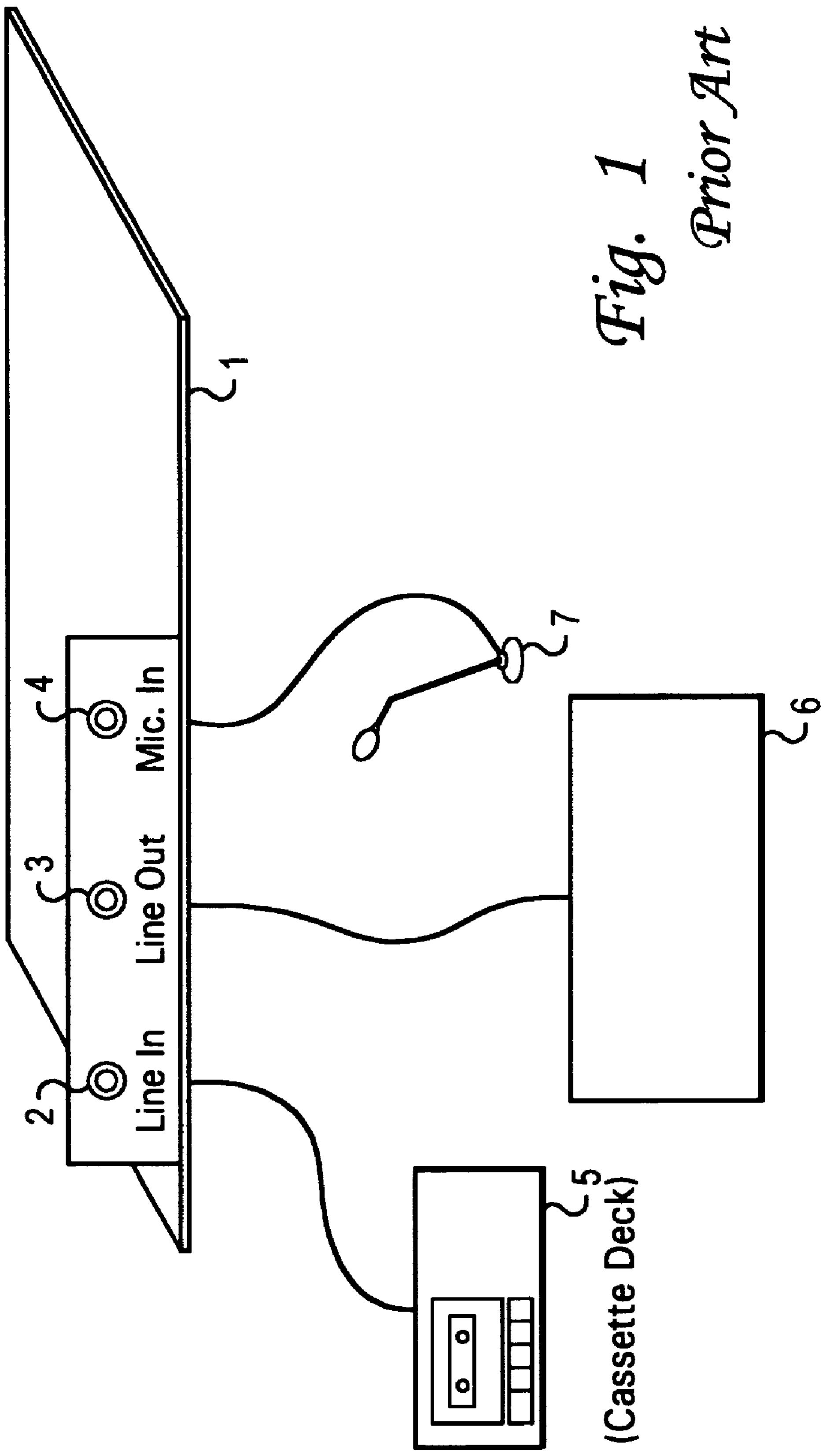
Fig. 1 Prior Art
FIG. 1 is a pictorial representation of a conventional motherboard (planar) for a computer system, wherein the motherboard has an audio subsystem with several different driving circuits and ports.
Figure 2:
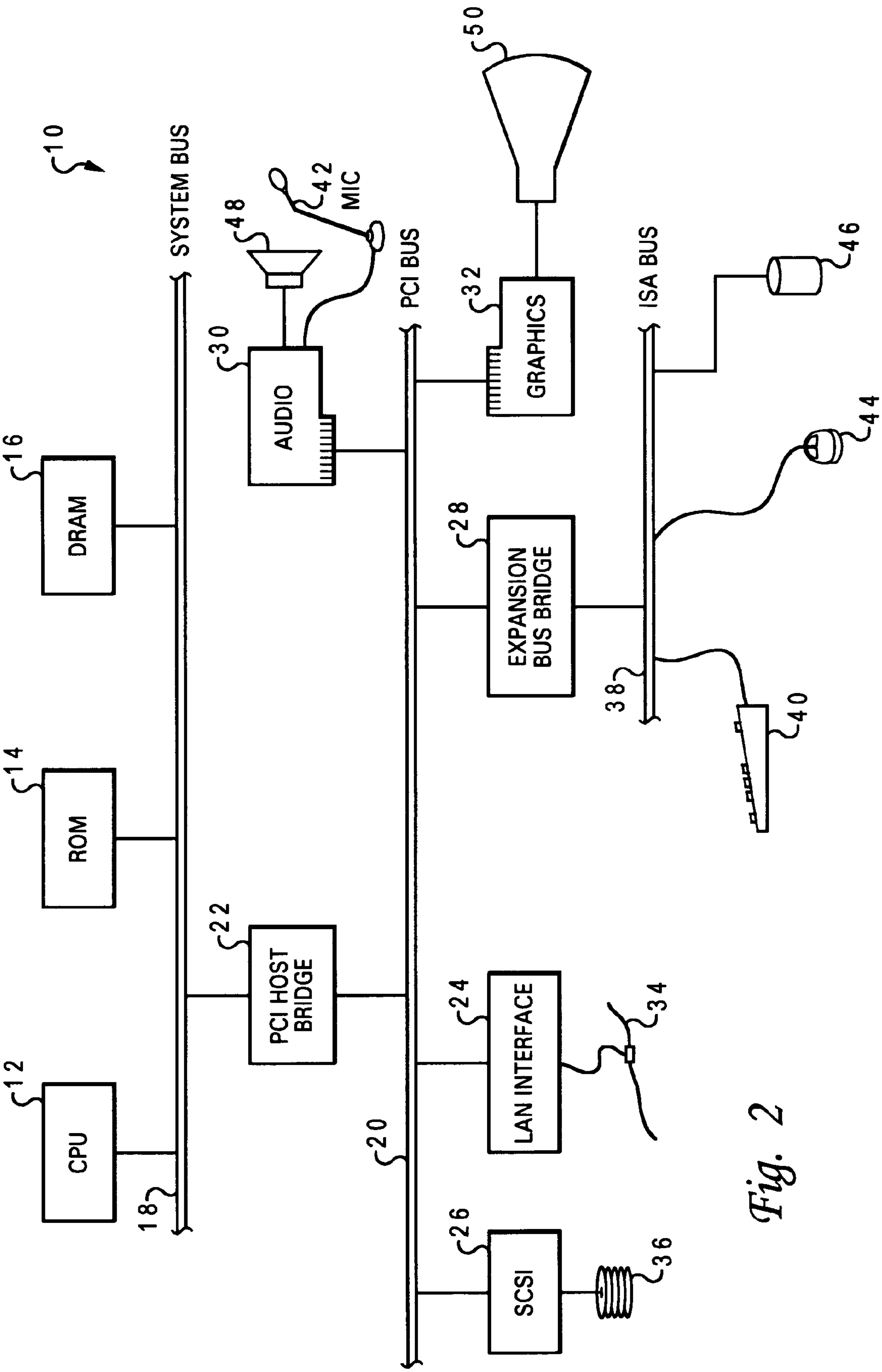
FIG. 2 is a block diagram depicting an illustrative embodiment of a data processing system with which the method and system of the present invention may advantageously be utilized.

With reference now to the figures, and in particular with reference to FIG. 2, there is depicted one embodiment 10 of a computer system 10 constructed in accordance with the present invention. System 10 includes a central processing unit (CPU) 12, firmware or read-only memory (ROM) 14, and a dynamic random access memory (DRAM) 16 which are all connected to a system bus 18. CPU 12, ROM 14 and DRAM 16 are also coupled to a PCI local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path allow the PCI devices to access DRAM 16.

Attached to PCI local bus 20 are a local area network (LAN) adapter 24, a small computer system interface (SCSI) adapter 26, an expansion bus bridge 28, an audio adapter 30, and a graphics adapter 32. LAN adapter 24 is used to connected computer system 10 to an external computer network 34. SCSI adapter 26 is used to control high-speed SCSI disk drive 36. Expansion bus bridge 28 is used to couple an ISA expansion bus 38 to PCI local bus 20. As shown, several user input devices are connected to ISA bus 38, including a keyboard 40 and a graphical pointing device (mouse) 44. Other devices may also be attached to ISA bus 38, such as a CD-ROM drive 46. Audio adapter 30 controls audio output to a speaker 48, and microphone 42, and graphics adapter 32 controls visual output to a display monitor 50.

Figure 3:
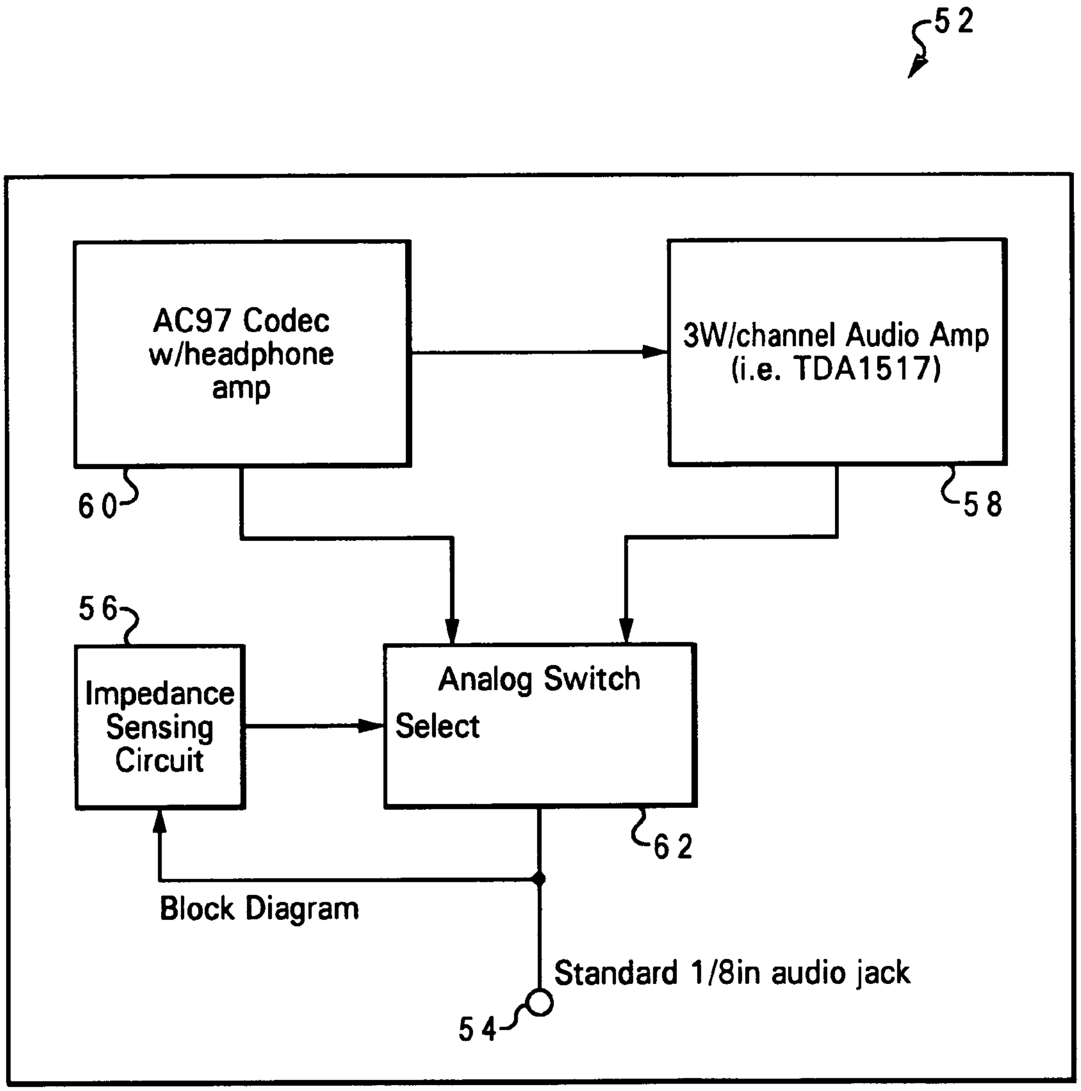
FIG. 3 is a block diagram illustrating a generalized implementation of an audio subsystem for the data processing system of FIG. 2 according to the present invention.

In accordance with an important aspect of the present invention, audio adapter 30 is designed to detect what type of speaker is attached to the system, and to power it appropriately. FIG. 3 illustrates a generalized implementation of a detection and powering circuit 52 for the audio subsystem according to the present invention. Speaker detection circuit 52 is comprised of a single audio output jack 54, an impedance sensing circuit 56, a passive speaker audio amplifier 58, AC97 audio codec and headphone amplifier 60, and an analog switch 62. Passive speaker amplifier 58 may be, e.g., a 3-watt TDA1517 amplifier, and AC97 audio codec and headphone amplifier 60 may be, e.g., a ¼-watt output from AC-97 coder/decoder (codec). Audio output jack 54 may be, e.g., a standard ⅛" audio output jack.

Impedance sensing circuit 56 determines whether a passive or active speaker is plugged in according to the impedance measured at audio jack 54. If the circuit senses a passive speaker as plugged in, it will provide the 3-watt output of on-board audio amplifier 58 to audio output jack 54. Conversely, if the circuit senses an active speaker as plugged in, it will provide the (line-out and headphone out) output of audio codec 60 to audio output jack 54. The output of impedance sensing circuit 56 acts as a select line to the 2-input analog switch (multiplexer) 62.

Figure 4:
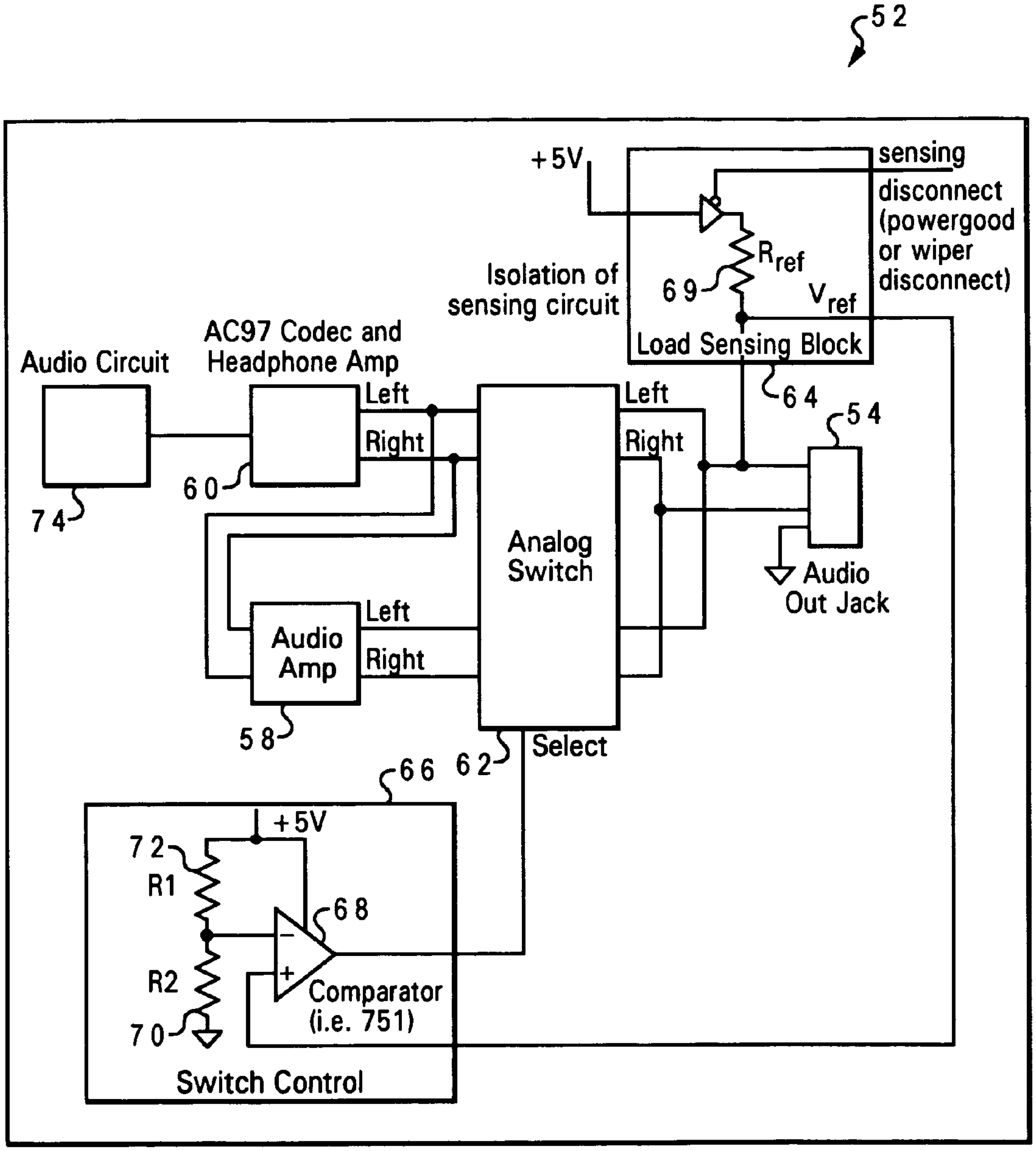
FIG. 4 is a block diagram of a more detailed embodiment of an audio subsystem according to the present invention.

A more detailed implementation for the detection and powering circuit of the present invention is shown in FIG. 4. In that block diagram, impedance sensing circuit 56 is further broken down into a load-sensing block 64 and a switch control 66. The amount of current sent to the speaker is sensed by measuring the voltage drop across $R_{ref}$ 69 (a resistor having a known resistance value) within load-sensing block 64. A comparator 68 in switch control 66 is used to compare this reference voltage to a known reference (based on resistors 70 and 72), and identify whether the load is low impedance (passive speakers) or high impedance (headphones or active speakers). The output of comparator 68 is sent to the select input of analog switch 62 to route the appropriate power source for the particular load (speaker). In the exemplary embodiment the audio signal is provided by audio circuit 74 to AC97 audio codec and headphone amplifier 60, and then passes on the signal to passive speaker amplifier 58.

The value of $R_{ref}$ is preferably not too low, so as to avoid consuming too much wattage, but also preferably not too high so as to allow the circuit to adequately distinguish between the different loads being detected (passive speaker are typically 4–8 ohms, headphones around 32 ohms, and active speakers around 1000+ ohms). An appropriate value for $R_{ref}$ is in the range of 100–500 ohms. For this particular implementation, if $V_{ref}$ is less than about 0.2 volts, this means passives speakers are connected, but if $V_{ref}$ is larger than about 0.2 volts, headphones or active speakers are connected.

In this manner, the present invention automatically detects the type of audio output device that is connected to the audio subsystem, and powers it appropriately, thereby preventing accidental product damage. This method also avoids any user intervention (i.e., BIOS or jumper settings), simplifying use, and further avoiding problems that may arise through user error.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been described in the context of an IBM-compatible personal computer (PC), those skilled in the art will appreciate that the invention is not limited to this specific computer architecture. It is therefore contemplated that such modifications can be made without departing from the spirit or scope of the present invention as defined in the appended claims.

The invention claimed is:

1. A method of powering an audio output device of a computer system, comprising the steps of:

determining whether a passive or active audio output device is connected to an audio output jack of the computer system; and based on said determining step, providing one of a plurality of different power levels to the audio output jack by selectively controlling the output of a switch device having a first input from an audio codec and headphone amplifier and a second input from a passive speaker amplifier wherein said audio codec and headphone amplifier has an output connected to an input of said passive speaker amplifier.

2. The method of claim 1, wherein said determining step includes the step of sensing an impedance at the audio output jack.

3. The method of claim 2, wherein said sensing step includes the step of comparing a load voltage associated with the impedance to a reference voltage.

4. The method of claim 1 wherein:

said determining step determines that a passive audio output device is connected to the audio output jack; and said providing step applies a 3-watt power signal to the audio output jack.

5. The method of claim 1, wherein:

said determining step determines that an active audio output device is connected to the audio output jack; and said providing step applies a ¼-watt power signal to the audio output jack.

6. A circuit for powering an audio output device of a computer system, comprising:

an audio output jack;

means for determining whether a passive or active audio output device is connected to said audio output jack; and means for providing one of a plurality of different power levels to said audio output jack based on said determining means, said means for providing including a switch device having a first input from an audio codec and headphone amplifier and a second input from a passive speaker amplifier wherein said audio codec and headphone amplifier has an output connected to an input of said passive speaker amplifier.

7. The circuit of claim 6, wherein said determining means includes means for sensing an impedance at said audio output jack.

8. The circuit of claim 7, wherein said sensing means includes the means for comparing a load voltage associated with the impedance to a reference voltage.

9. The circuit of claim 6, wherein when said determining means determines that a passive audio output device is connected to said audio output jack, said providing means applies a 3-watt power signal to said audio output jack.

10. The circuit of claim 9, wherein said active audio output device is a headphone.

11. The circuit of claim 6, wherein when said determining means determines that an active audio output device is connected to said audio output jack, said providing means applies a ¼-watt power signal to said audio output jack.

* * * * *